(12) United States Patent
Wei et al.

(10) Patent No.: US 9,514,965 B2
(45) Date of Patent: Dec. 6, 2016

(54) SUBSTRATE SURFACE METALLIZATION METHOD AND SUBSTRATE HAVING METALLIZED SURFACE MANUFACTURED BY THE SAME

(71) Applicant: National Tsing Hua University, Hsinchu (TW)

(72) Inventors: Tzu-Chien Wei, Hsinchu (TW); Chih-Ming Chen, Taichung (TW); Tseng-Chieh Pan, Hsinchu (TW); Kuei-Chang Lai, Taichung (TW); Chung-Han Wu, Miaoli County (TW); Kuei-Po Chen, Miaoli County (TW); Nai-Tien Ou, Miaoli County (TW); Kuei-Wu Huang, Miaoli County (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/957,787

(22) Filed: Dec. 3, 2015

(65) Prior Publication Data

US 2016/0163567 A1 Jun. 9, 2016

(30) Foreign Application Priority Data

Dec. 5, 2014 (TW) .............................. 103142351 A

(51) Int. Cl.
*H01L 23/48* (2006.01)
*H01L 21/48* (2006.01)
(Continued)

(52) U.S. Cl.
CPC ......... *H01L 21/4846* (2013.01); *H01L 21/486* (2013.01); *H01L 27/14625* (2013.01); *H01L 27/14643* (2013.01); *H01L 27/3276* (2013.01)

(58) Field of Classification Search
None
See application file for complete search history.

(56) References Cited

U.S. PATENT DOCUMENTS 5,990,984 A * 11/1999 Meredith, Jr. ......... G02B 1/105
348/834
7,854,995 B1 * 12/2010 Anderson ................ B21K 1/30
428/546

(Continued)

FOREIGN PATENT DOCUMENTS

TW 201416490 A 5/2014

OTHER PUBLICATIONS

E Metwalli, et al., "Surface characterizations of mono-, di, and tri-aminosilane treated glass substrates", Journal of Colloid and Interface Science 298 (2006) 825-831, available online Mar. 27, 2006, www.sciencedirect.com.

*Primary Examiner* — Thanh T Nguyen
(74) *Attorney, Agent, or Firm* — Li & Cai Intellectual Property (USA) Office

(57) ABSTRACT

A substrate having metallized surface is provided. The substrate having metallized surface includes a silicon substrate, an adhesive layer and a metallic layer. The silicon substrate has a silanated surface and the adhesive layer is disposed on the silanated surface. The metallic layer bonds to the silanated surface through the adhesive layer. The adhesive layer is formed with a plurality of colloidal nanoparticle groups, the colloidal nanoparticle groups each include at least one metallic nanoparticle capped with at least one polymer, and the metallic layer and the adhesive layer have chemical bonds formed there between.

9 Claims, 7 Drawing Sheets

(51) Int. Cl.
*H01L 27/32* (2006.01)
*H01L 27/146* (2006.01)

(56) References Cited

U.S. PATENT DOCUMENTS

| | | | | |
|---|---|---|---|---|
| 2004/0253427 | A1* | 12/2004 | Yokogawa | C09D 7/1291 428/212 |
| 2005/0221054 | A1* | 10/2005 | Kawano | G02B 1/105 428/143 |
| 2007/0003741 | A1* | 1/2007 | Sakurai | G03G 7/0013 428/195.1 |
| 2009/0140218 | A1* | 6/2009 | Inaba | H01B 1/22 252/519.31 |
| 2015/0233876 | A1* | 8/2015 | Dellea | G01N 30/60 427/535 |

\* cited by examiner

SUBSTRATE SURFACE METALLIZATION METHOD AND SUBSTRATE HAVING METALLIZED SURFACE MANUFACTURED BY THE SAME

BACKGROUND OF THE INVENTION

1. Field of the Invention

The present disclosure relates to a surface metallization method and a substrate having metallized surface manufactured by the same, and pertains particularly to a surface metallization method for silicon substrate and a silicon substrate having metallized surface manufactured by the same.

2. Description of Related Art

Common techniques in silicon substrate surface metallization are, for example, screen-printing process, hybrid silver contact process, ink jetting process, and vapor deposition process. With the increasing price of silver, the costs of the above processes have gradually increased. Especially expensive is the vapor deposition process which includes a plurality of steps, increasing the cost, and the metal target used in the vapor deposition process.

It is generally believed that, one preferred technique in substrate surface metallization is electrochemical plating, which relies on the presence of a catalyst. For example, in the art of printed circuit board manufacturing, the catalyst used in the electroless nickel plating is palladium tin colloid. However, the surface to be plated must to be etched to form a porous structure before electroless plating, to improve the adhesion between the palladium tin colloid and the surface of the substrate. Therefore, in electroless plating by using palladium tin colloid as a catalyst on the substrate surface having a preferred smoothness without porous structure, the poor adhesion between the palladium tin colloid and the substrate surface has become an issue that needs to be solved.

SUMMARY OF THE INVENTION

The embodiment of the instant disclosure provides a substrate surface metallization method, which utilizes electroless plating for forming a metallic layer on a surface of the substrate, and utilizes the chemical bonds formed between the surface to be plated that is modified and colloidal nanoparticle groups to enhance the adhesion between the electroless metallic layer and the surface of the substrate.

The present disclosure provides a substrate surface metallization method including the following steps. First, provide a silicon substrate having a surface. Then, modify the surface of the silicon substrate by using at least one silane compound. Then, deposit a plurality of colloidal nanoparticle groups to the surface of the silicon substrate; the colloidal nanoparticle groups each include at least one palladium nanoparticle capped with at least one polymer. Then, electroless plate the surface of the silicon substrate to form an electroless metallic layer on the surface of the silicon substrate.

The present disclosure also provides a substrate having metallized surface. The substrate having metallized surface includes: a silicon substrate, an adhesive layer, and an electroless metallic layer. The silicon substrate has a silanated surface. The adhesive layer is disposed on the silanated surface and formed with a plurality of colloidal nanoparticle groups. The colloidal nanoparticle groups each include at least one palladium nanoparticle capped with at least one polymer. The electroless metallic layer is bonded to the silanated surface through the adhesive layer. The electroless metallic layer and the adhesive layer have chemical bonds formed there between.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1A:
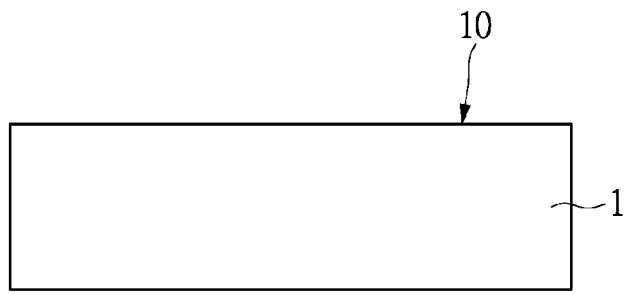
FIG. 1A illustrates a cross-sectional view of a substrate having metallized surface during one exemplary fabrication step according to an embodiment of the present disclosure.
Figure 1B:
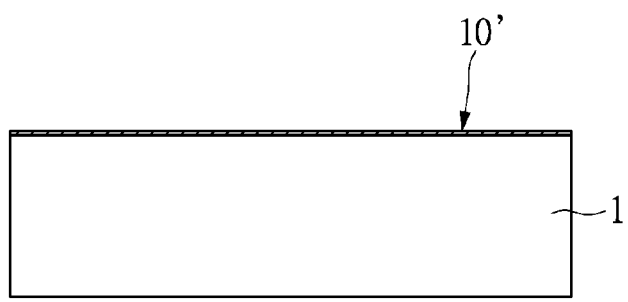
FIG. 1B illustrates a cross-sectional view of the substrate having metallized surface during one exemplary fabrication step according to an embodiment of the present disclosure.
Figure 1C:
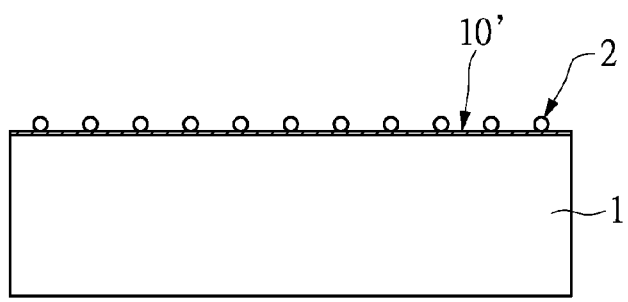
FIG. 1C illustrates a cross-sectional view of the substrate having metallized surface during one exemplary fabrication step according to an embodiment of the present disclosure.
Figure 1D:
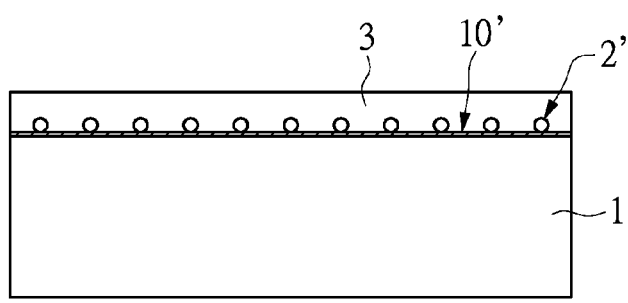
FIG. 1D illustrates a cross-sectional view of the substrate having metallized surface according to an embodiment of the present disclosure.

Please refer to FIG. 1A to FIG. 1D for explanation of a substrate surface metallization method according to the present disclosure. FIG. 1A to FIG. 1C each illustrate a cross-sectional view of a substrate having metallized surface during one exemplary fabrication step according to an embodiment of the present disclosure. FIG. 1D illustrates a cross-sectional view of the substrate having metallized surface according to an embodiment of the present disclosure.

As shown in FIG. 1A and FIG. 1B, in the substrate surface metallization method, a silicon substrate 1 having a surface 10 is first provided. Subsequently, the surface 10 of the silicon substrate 1 is modified by using at least one silane compound, such as aminosilane compound. In the process of the surface modification, the amino silane compound having a sensitive center for hydrolysis can act as a bridge for the boding between an organic material and an inorganic material, whereby the surface 10 is modified with the amino functional group of the aminosilane compound. Specifically, the surface 10 of the silicon substrate 1 can be modified by a self-assembly monolayer (SAM) process under room temperature.

To put it concretely, the mechanism of the surface modification can include four sections: hydrolysis, condensation, hydrogen bonding, and bond formation. The starting section (i.e. hydrolysis) is the rate-determining section, and two of the following sections (i.e. condensation and hydrogen bonding) are spontaneous reactions. In the final section (i.e. bond formation), a dewatering process is carried out for the formation of covalent bonds. For example, the silicon substrate 1 can be dewatered by heating (such as heating by an oven at 120 Celsius degrees for 30 to 90 minutes) or by vacuuming (for 2 to 6 hours).

The molecular formula of the aminosilane compound used in modifying the surface 10 of the silicon substrate 1 in the present embodiment is, as a specific example, (X)3SiY, in which X represents the tentacle for grafting and Y represents the amino functional group. X in (X)3SiY can be —OCH3, —OCH2CH3, or —Cl. The amino functional group of the aminosilane compound is the key for the surface modification. Y in (X)3SiY can be olefin, thiol, amine, halocarbon, hydrocarbon, or other organic functional group.

After modifying the surface 10 of the silicon substrate 1 by using the silane compound having amino functional groups (e.g. coating the surface 10 of the silicon substrate 1 with a silane layer having amino functional groups), molecules with negative charges are easily bonded to the modified surface 10' having positive charges. The amino functional groups tend to be protonated in an acidic environment, whereby the surface 10' modified with the silane compound having amino functional groups can have positive charges. Accordingly, the silane compound having amino functional groups can act as a catalyst adsorbed layer for enhancing the adhesion between the surface 10' of a silicon substrate 1 and a catalyst, thus to increase the adhesion between the surface 10' of a silicon substrate 1 and an electroless metallic layer.

In the present embodiment, aminosilanes having various numbers of amino-groups, such as mono-aminosilanes, di-aminosilanes, and tri-aminosilanes, can be applied in the dip-coating process for modifying the surface 10 of the silicon substrate 1. The aminosilane compound can be 3-aminopropyltriethoxysilane (APS), N-(2-aminoethyl)-3-aminopropyltrimethoxysilane (EDA), or (3-trimethoxysilylpropyl) diethylenetriamine (DETA).

The structural formula of the APS can be the following:

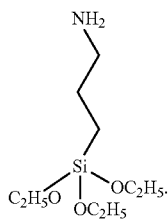

The structural formula of the EDA can be the following:

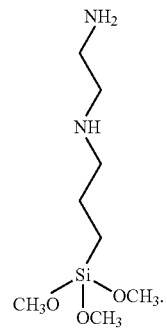

The structural formula of the DETA can be the following:

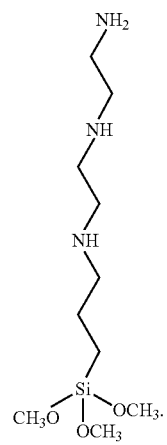

In an exemplary embodiment, the positive charges on the modified surface 10' of the silicon substrate 1 can be provided by the following amino-groups: =NH+−, =NH2+−, —NH3+, and —NH2.

Next, as shown in FIG. 1C, depositing a plurality of colloidal nanoparticle groups to the surface 10' of the silicon substrate 1 to form an adhesive layer 2. The colloidal nanoparticle groups each include at least one palladium nanoparticle capped with at least one polymer. For example, the polymer can be selected from the group consisting of polyvinylpyrrolidone (PVP), polyvinyl alcohol (PVA), polyacrylic acid (PAA), and any combination thereof.

The palladium nanoparticle in each of the colloidal nanoparticle groups is capped with the polymer and the colloidal nanoparticle groups each are attached to the modified surface 10' with the polymer, such that chemical bonds are formed between the polymer and the modified surface 10'. On the other hand, in the application of a palladium tin colloid catalyst of the prior art, the palladium tin colloid catalyst is attached to the surface of the substrate merely through the palladium atoms thereof. In addition, the amount of the colloidal nanoparticle groups attached to the modified surface 10' is greater than that in the application of the palladium tin colloid catalyst of the prior art.

In an embodiment of the present disclosure, the colloidal nanoparticle group can be prepared by a wet process, in which a metallic precursor protected by a stabilizer is reduced by using a reducing agent. The stabilizer can be a ligand or a polymer. The size and the stability of the colloidal nanoparticle group are related to the synthesis of the stabilizer in the colloidal nanoparticles. Therefore, the stabilizer used in the wet process of preparing the colloidal nanoparticle group may be selected according to need. For example, a nitrogen-rich ligand or a water-soluble ligand can be used as the stabilizer protecting palladium colloidal nanoparticles. The nitrogen-rich ligand can be phenanthroline or sodium sulfanilat. The water-soluble ligand can be isocyanides. The reducing agent used in the wet process of preparing the colloidal nanoparticle group may be an alcohol, such as methanol, ethanol, propanol, isopropanol, butanol and ethylene glycol.

It is worth mentioning that, the size of the colloidal nanoparticle group formed in the wet process can be controlled by regulating the concentration of the ligand. Using a long chain ligand, increasing the concentration of the stabilizer, or lengthening the reaction time can contribute to the formation of the colloidal nanoparticle group having a smaller size.

In the present embodiment, each of the colloidal nanoparticle groups bonded to the modified surface 10' of the silicon substrate 1 can be a polyvinylpyrrolidone capped palladium (PVP-Pd) group. In other words, the polyvinylpyrrolidone (PVP) can be used as the stabilizer of the palladium nanoparticles. The tail end or the ring segment of the PVP polymer dispersed in a solvent forms a bulky molecule barrier, which can effectively prevent the aggregation of the nanoparticles.

Compared to the PVP polymers of smaller molecular weights, more PVP polymers of large molecular weights are attached to the nanoparticle group. In addition, the greater the molecular weights of the PVP polymers attached to the nanoparticle group, the thicker the capped layer arranged peripherally around the nanoparticle group. Accordingly, the greater the molecular weights of the PVP polymers, the greater the size (e.g. diameter) of the colloidal nanoparticle group. The size of the colloidal nanoparticle group is related to the molecule weight of the PVP polymer, while the nucleation and growth rate are related to the pH value of the solvent, the temperature, and the reducing agent used. The size of the colloidal nanoparticle group is inversely proportional to the reduction capability of the reducing agent. As a specific example, the PVP polymer has molecular weight ranging from 5000 to 10000, and the colloidal nanoparticle groups each have a diameter ranging from 5 nanometers to 10 nanometers.

Next, as shown in FIG. 1D, an electroless metallic layer 3 is formed on the surface 10' of the silicon substrate 1 by electroless plating (i.e. autocatalytic plating). The electroless plating relies on the presence of a catalyst, for example a catalytic metallic layer initially formed on the surface to be plated, which reacts with the metal ions to deposit metal. Alternatively, the surface to be plated itself can be used as the catalyst for activating.

Usually an electrolytic cell (consisting of two electrodes, an electrolyte, and external source of current) is used for electroplating. In contrast, an electroless plating process uses only one electrode and no external source of electric current. Although the electroless plating is different form the electroplating, the following describes the oxidation-reduction reaction of the electroless plating in view of anode and cathode, as shown in the following equations (a) to (f), wherein R represents a reducing agent, Mn+ represents a metal ion, and M represents a metal. The electrons in the oxidation-reduction reaction come from the oxidation of a reducing agent (equation (b)) or the oxidation of hydrogen (equation (d)).

Anode:

Dehydrogenation: RH→R+H  (a)

Oxidation: R+OH-→ROH+$e$-  (b)

Recombination: H+H→H2  (c)

Oxidation: H+OH-→H2O+$e$-  (d)

Cathode:

Metal deposition: Mn++$ne$-→M  (e)

Hydrogen evolution: 2H2O+2$e$-→H2+2OH—  (f)

In the electroless plating process, the reducing agent, for example sodium hypophosphite, formaldehyde, hydrazine, borohydride and amine borane, acts as the anode. The tendency of each of these reducing agents to be oxidized with respect to various metal ions is different.

It is worth mentioning that, in the electroplating process of the present embodiment, the colloidal nanoparticle groups bonded to the surface 10' of the silicon substrate 1 can be used as the catalyst for activating, which reacts with the metal ions to deposit metal on the surface 10'. The metal deposited on the surface 10' can act as the catalyst for the subsequent reactions.

In an exemplary embodiment, the electroless plating is electroless nickel plating, and the electroless metallic layer 3 formed on the surface 10' of the silicon substrate 1 is a nickel layer or a nickel alloy layer. Hypophosphite can be used as the reducing agent in the electroless nickel plating. At higher temperatures, unstable hypophosphite ion releases hydrogen atoms, which are then absorbed by the catalyst, for activating the subsequent reactions of the electroless deposition for forming the electroless metallic layer 3 formed on the surface 10' of the silicon substrate 1.

To sum up, the substrate surface metallization method according to the instant disclosure utilizes the electroless plating, in which the electroless metallic layer having a smaller porosity can be evenly formed on the surface of the substrate. The substrate surface metallization method can be applied to substrates having various shapes, for obtaining an electroless metallic layer having a preferred thickness evenly formed on the surface of the substrate. In addition, the deposition process can be performed without any electroplating equipment, which is costly.

The substrate surface metallization method according to the instant disclosure further improves the formation of the electroless metallic layer. Specifically, the substrate surface metallization method utilizes the aminosilane compounds, which are bonded to the surface to be plated and act as the bridge for the connection between organic materials and inorganic materials, to modify the surface to be plated. More importantly, the substrate surface metallization method utilizes the colloidal nanoparticle groups to form an adhesive layer 2' on the modified surface 10', in which chemical bonds (having greater bonding force than Van der Waals force) are formed between the amino functional groups of the modified surface 10' and the colloidal nanoparticle groups, whereby the adhesion between the electroless metallic layer and the surface of the silicon substrate can be increased.

As shown in FIG. 1D, the present disclosure further provides a substrate having metallized surface. The substrate having metallized surface includes a silicon substrate 1, an adhesive layer 2', and an electroless metallic layer 3. The silicon substrate 1 has a silanated surface 10'. The adhesive layer 2' is disposed on the silanated surface 10' and formed with a plurality of colloidal nanoparticle groups. The colloidal nanoparticle groups each include at least one metallic nanoparticle capped with at least one polymer. The electroless metallic layer 3 is bonded to the silanated surface 10' through the adhesive layer 2'. The electroless metallic layer 3 and the adhesive layer 2' have chemical bonds formed there between.

PREFERRED EMBODIMENT

A silicon substrate, such as an n-type silicon wafer doped with p-type impurities, is first provided. Subsequently, the surface of the silicon wafer is washed with deionized water. Next, the surface of the silicon wafer to be plated is modified by using aminosilane compounds. The process of modifying the surface can include the following phases: the formation of OH group on the surface, liquid-phase deposition, and baking. The following describes the process of modifying the surface in detail.

Figure 2:
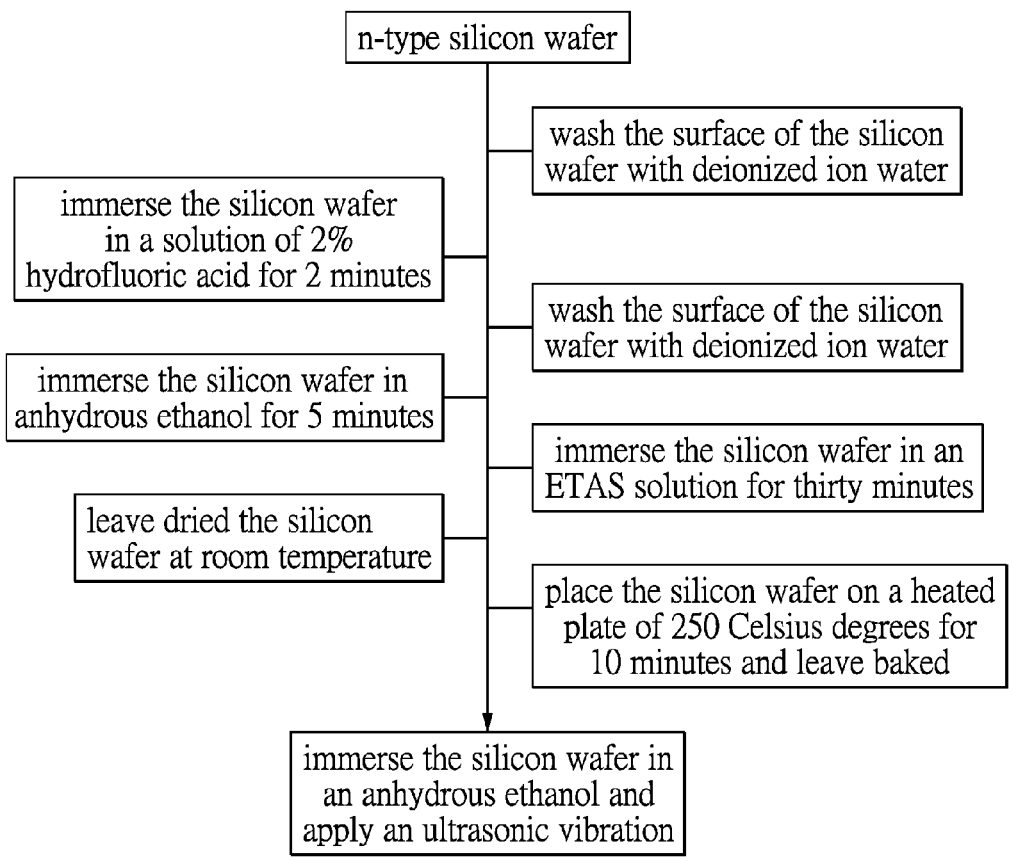
FIG. 2 is a flowchart of a method of modifying a surface of a silicon substrate by using a silane compound according to an embodiment of the present disclosure.

Referring to FIG. 2, which is a flowchart of a method of modifying a surface of a silicon substrate by using a silane compound according to an embodiment of the present disclosure. The silicon wafer is first immersed in a solution of 2% hydrofluoric acid for 2 minutes for removing the oxide layer on the surface of the silicon wafer. Next, the surface of the silicon wafer is washed with deionized water. The silicon wafer is then immersed in anhydrous ethanol for 5 minutes for surface oxidation, in which OH groups can be formed on the surface of the silicon wafer to be plated. Next, the silicon wafer is immersed in an ETAS (3-[2-(2-Aminoethylamine)ethyl-amino]propyltrimethoxysilane) solution. In the ETAS solution, the volume ratio of anhydrous ethanol to ETAS is 99 to 1, and the structural formula of ETAS is

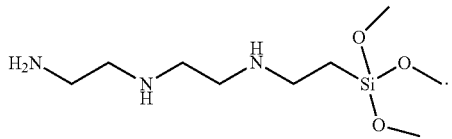 [SMILES: CO[Si](CCNCCNCCN)(OC)OC]

The silicon wafer can be immersed in the ETAS solution for 10, 20, 30, or 60 minutes. In a preferred embodiment of the present disclosure, the silicon wafer is immersed in the ETAS solution for 30 minutes. It is worth noting that, the substrate surface metallization method of the present disclosure utilizes the anhydrous ethanol for surface oxidation, thus the surface to be plated can be modified evenly.

Next, the silicon wafer is taken out from the solution and left to dry at room temperature for about 2 minutes to let the solvent remain on the surface to evaporate for preventing water marks from being generated on the surface to be plated. The silicon wafer is next placed and baked on a heated plate of 250 Celsius degrees for 10 minutes. Next, the silicon wafer is immersed in an anhydrous ethanol and an ultrasonic vibration is applied for 10 minutes for removing the aminosilane molecules that are physically attached to the periphery of the self-assembly monolayer. The silicon wafer is then washed with deionized water. Accordingly, the step of modifying the surface to be plated of the substrate surface metallization method is established.

Figure 3:
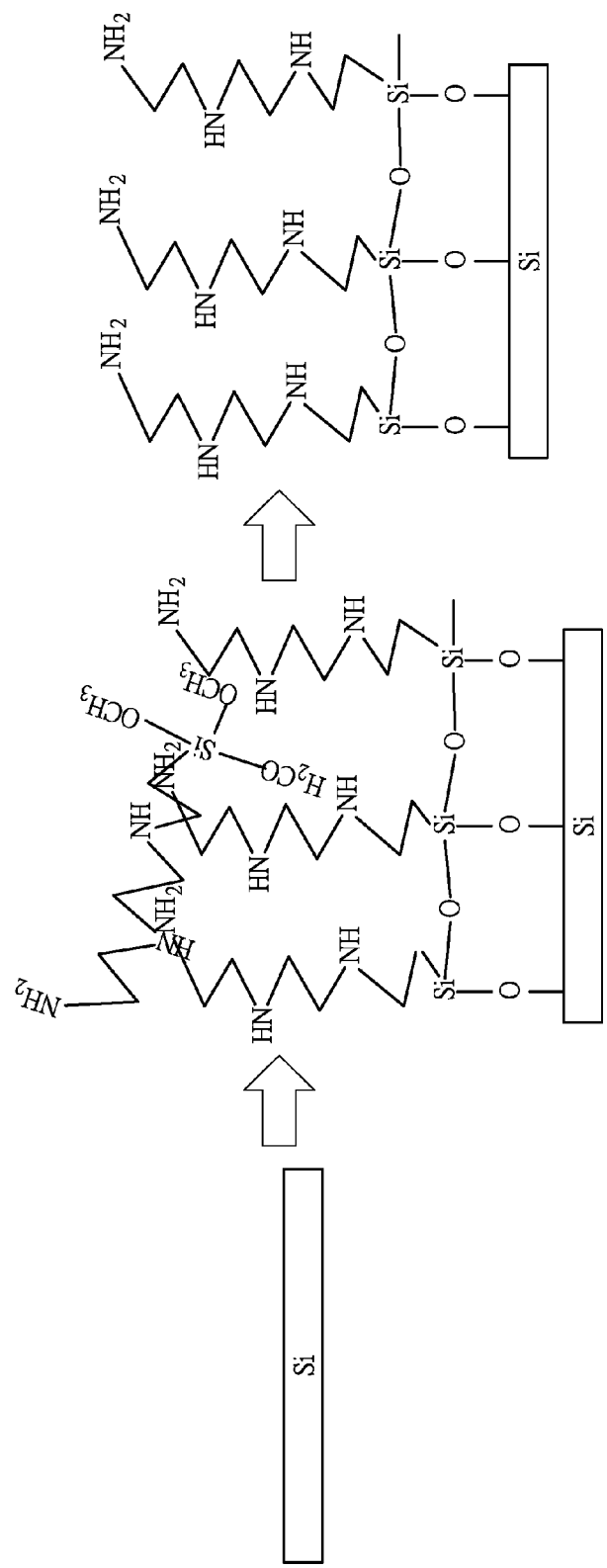
FIG. 3 illustrates the silicon substrate during the step of modifying the surface by using the silane compound and the step of applying an ultrasonic vibration according to an embodiment of the present disclosure.

Refer to FIG. 3, which illustrates the silicon substrate during the step of modifying the surface by using the silane compound and the step of applying an ultrasonic vibration according to an embodiment of the present disclosure. Before the step of applying the ultrasonic vibration, the aminosilane molecules are stacked in multilayers. After the step of applying the ultrasonic vibration, the thickness of the self-assembly structure is reduced to monolayer.

Figure 4:
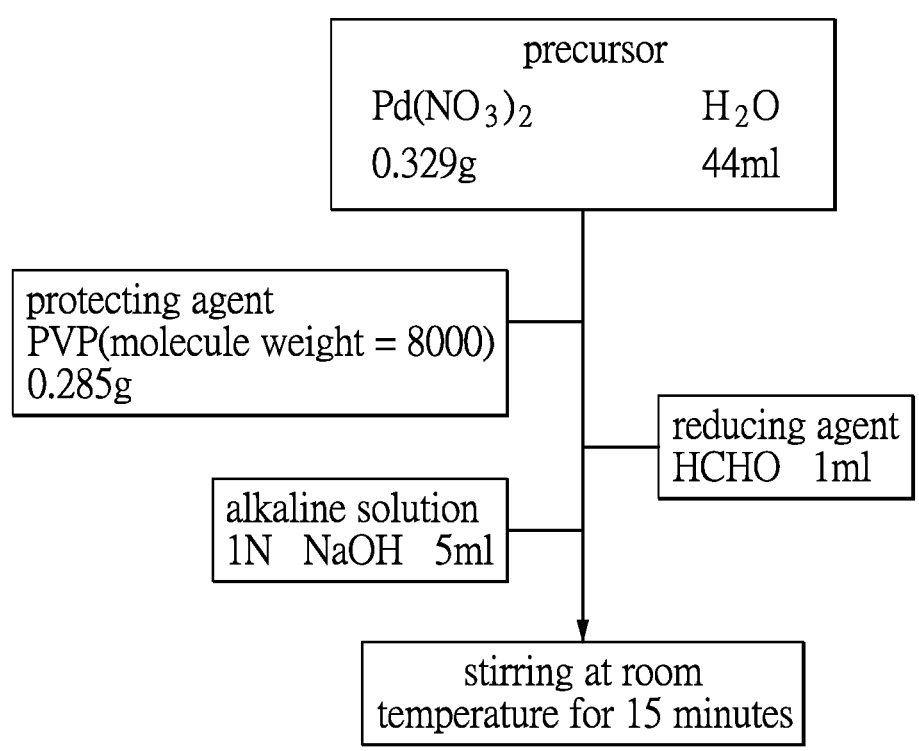
FIG. 4 is a flowchart of a method of preparing polyvinylpyrrolidone capped palladium according to an embodiment of the present disclosure.

After the step of modifying the surface of the silicon wafer, the silicon wafer is immersed in a polyvinylpyrrolidone capped palladium (PVP-Pd) solution. The following describes the process for preparing the PVP-Pd solution. Referring to FIG. 4, which is a flowchart of a method of preparing polyvinylpyrrolidone capped palladium according to an embodiment of the present disclosure. First, dissolve 0.285 grams of PVP (Poly (N-vinyl-2-pyrrolidone)) in about 44 milliliters of deionized water for preparing a PVP solution. The molecule weight of the PVP is 8000, and the structural formula of the PVP is

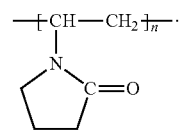

Next, dissolve a precursor, for example 0.329 grams of Pd(NO3)2 having Pd ions, in the PVP solution, such that the color of the PVP solution turns to brown. A reducing agent, for example 1 milliliter of HCHO, is subsequently added to the PVP solution. Next, 5 ml, 1 N of sodium hydroxide (NaOH) is slowly added to the PVP solution, such that the color of the PVP solution turns from brown to black. Accordingly, the step of preparing the PVP-Pd solution of the substrate surface metallization method is established.

When used, the PVP-Pd solution can be diluted according to need and heated to 40 Celsius degrees. The silicon wafer is then immersed in the PVP-Pd solution. For example, the concentration of the PVP-Pd solution can be 50 ppm, 100 ppm, 1250 ppm, or 2500 ppm.

Figure 5:
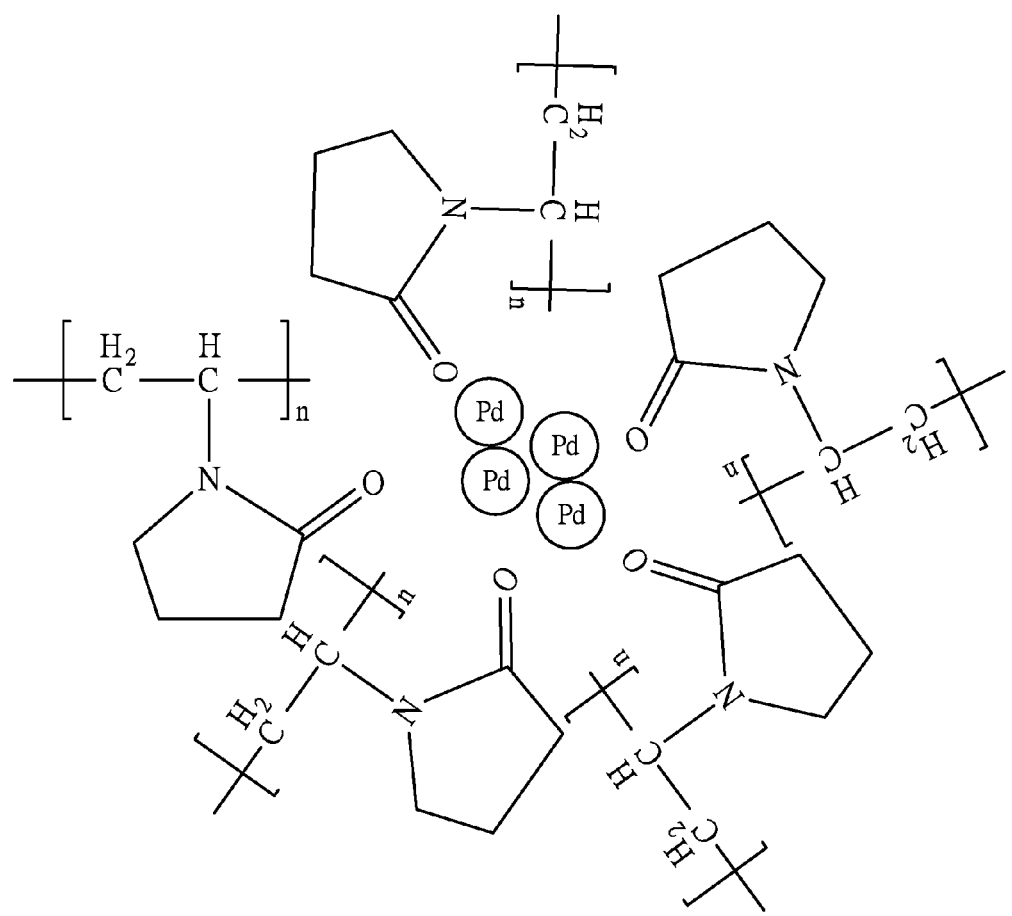
FIG. 5 illustrates a colloidal nanoparticle group according to an embodiment of the present disclosure.

Refer to FIG. 5, which illustrates a colloidal nanoparticle group according to an embodiment of the present disclosure. In the present embodiment, the colloidal nanoparticle groups each have a diameter of 5 nanometers. The arrangement of the Pd nanoparticles and the PVP molecules in each of the colloidal nanoparticle groups is similar to that of ZnS and the PVP molecules act as protecting agents. As shown in FIG. 5, the Pd nanoparticles are capped with the oxygen atoms of the PVP molecules. It is worth mentioning that, the greater the concentration of the colloidal nanoparticle group solution, the more colloidal nanoparticle groups bonded to the surface of the silicon wafer, and the greater the sizes of the colloidal nanoparticle groups bonded.

Chemical bonds can be formed between the colloidal nanoparticle groups and the modified surface having amino functional groups. In addition, the colloidal nanoparticle groups bonded to the surface of the silicon wafer can be used as the catalyst for activating in the electroless plating, whereby the adhesion between the surface of the silicon wafer and the electroless metallic layer formed therein is enhanced.

Next, electroless plating is carried out for forming the electroless metallic layer on the surface of the silicon substrate. Specifically, after taken out of the colloidal nanoparticle group solution and washed with deionized water, the silicon wafer is immersed in the electroless nickel plating solution (9026M Electrodes Nickel) provided by OMG (Asia)Electronic Chemicals Co., Ltd, Taoyuan County, Taiwan. As a specific example, the silicon wafer is immersed in the electroless nickel plating solution for 5 seconds to 180 seconds, at 80 Celsius degrees, pH 4.9. Accordingly, the step of electroless plating the surface of the silicon substrate of the substrate surface metallization method is established.

By a scanning electron microscope, the growth of the film thickness of electroless nickel deposition can be observed. The greater the concentration of the colloidal nanoparticle group solution (e.g. PVP-Pd solution) used, the more the electroless nickel-phosphorus alloy particles formed at the interface of the silicon wafer and the plating layer, and the greater the sizes of the electroless nickel-phosphorus alloy particles. The plating rate is not directly related to the concentration of the colloidal nanoparticle group solution used. In an exemplary embodiment, in the electroless deposition for forming a nickel layer having a thickness of about 200 nanometers on the silicon wafer, the deposition time can be controlled in substantially one minute.

Figure 6:
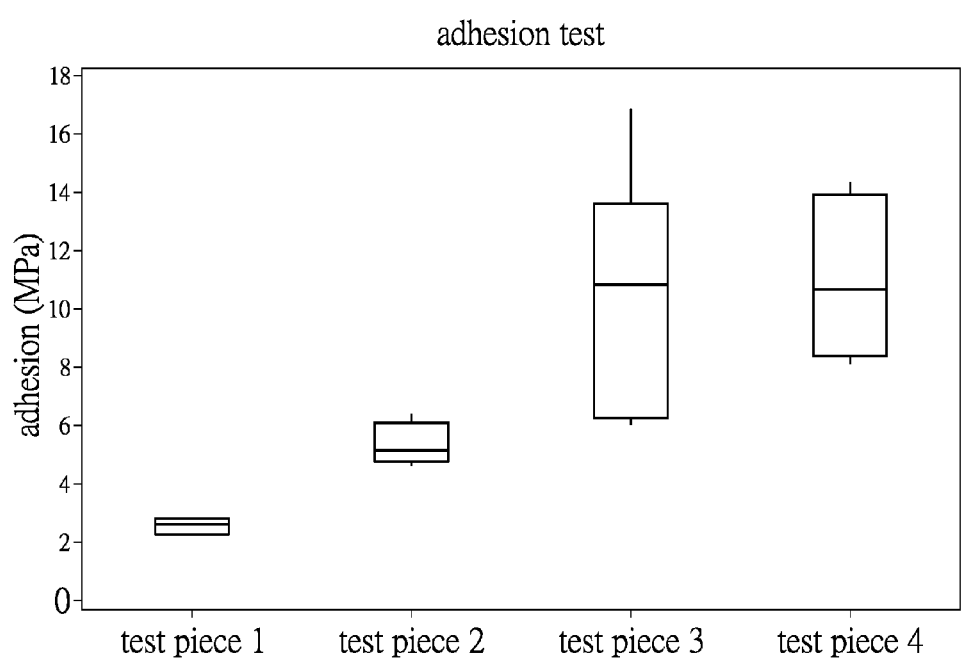
FIG. 6 shows test results for physical and mechanical properties of a nickel-silicon interface according to an embodiment of the present disclosure.

The following describes the tests performed for physical and mechanical properties of the surfaces of silicon substrates metallized according to the above embodiment and other embodiments. Referring to FIG. 6, which shows test results for physical and mechanical properties of a nickel-silicon interface according to an embodiment of the present disclosure.

The tests are carried out by the standard test method ASTM D4541 for pull-off strength of coatings using portable adhesion testers. First, each of the test pieces (e.g. the substrates each having metallized surface) is adhered to a glass substrate by a large amount of epoxy resin, and a dolly (which has a diameter of 10 mm) is adhered to the surface to be tested by epoxy resin. Each of the test pieces adhered with the glass substrate and the dolly is left for 3 hours and then baked in an oven for 2 hours at 70 Celsius degrees. After the test pieces are taken out of the oven and left to cool. A pull-off strength (commonly referred to as adhesion) of the plating layer of each of the test pieces is obtained by using an adhesion tester. The silicon substrate of the test piece 1 is formed with a surface to be plated having commercial tin colloid palladium catalysts attached thereto. The silicon substrate of the test piece 2 is formed with a surface to be plated, which is firstly modified by using ETAS and then catalyzed by using commercial tin colloid palladium catalysts. The silicon substrate of the test piece 3 is formed with a surface to be plated, which is firstly modified by using ETAS and then immersed in a 50 ppm PVP-Pd solution. The silicon substrate of the test piece 4 is formed with a surface to be plated, which is firstly modified by using ETAS and then immersed in a 100 ppm PVP-Pd solution. The test results are shown in FIG. 6 and listed in the following chart.

| test piece | Average adhesion (MPa) |
| --- | --- |
| test piece 1 | 2.57 |
| test piece 2 | 5.36 |
| test piece 3 | 10.6 |
| test piece 4 | 11 |

As shown in the above chart, the adhesion of the plating layer of the test piece, which is formed by the process including the step of modifying the surface to be plated by using ETAS and the step of depositing a plurality of PVP-Pd groups to the surface to be plated, is improved, compared with that of the test piece. Especially, comparing the adhesion of the plating layer of the test pieces 1 and 2, which are formed by using commercial tin colloid palladium as catalyst, it is worth noting that, the adhesion of the plating layer of the test piece can be improved by modifying the surface to be plated by using ETAS. Furthermore, as shown in FIG. 6, the standard deviations of the test pieces 3, 4, which are formed by using PVP-Pd, are greater than those of the other two test pieces.

Figure 7A:
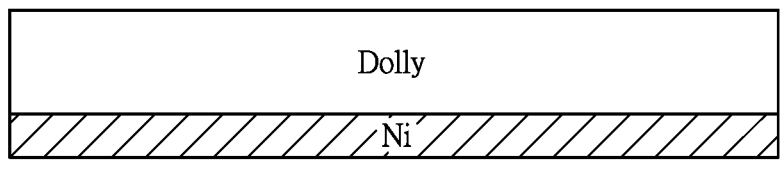
FIG. 7A and FIG. 7B show results of pull out test for the substrate having metallized surface formed by using a 50 ppm PVP-Pd solution according to an embodiment of the present disclosure.
Figure 7A:
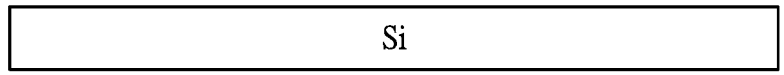
Figure 7B:
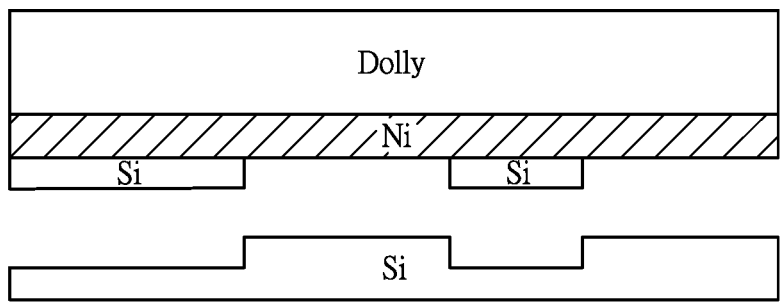

Particularly, the cleavage planes of the test pieces generated during the pull-out tests may have different configurations. Referring to FIG. 7A and FIG. 7B, which show results of a pull out test of the substrate having a metallized surface formed by using a 50 ppm PVP-Pd solution according to an embodiment of the present disclosure. FIG. 7A and FIG. 7B show two different configurations of the cleavage plane of the test piece, which is formed by the process including the step of modifying the surface to be plated by using ETAS and the step of depositing a plurality of PVP-Pd groups to the surface to be plated by using a 50 ppm PVP-Pd solution. In the configuration shown in FIG. 7A, the Ni layer is entirely separated from the silicon surface. That is, the cleavage plane is generated via an out-of-phase separation. In the configuration shown in FIG. 7B, the silicon substrate is fragmented, which results from the large adhesion force in parts of the Si-Ni interface, and some of the cleavages are generated within the silicon substrate via an in-phase separation.

In the cases where the Ni layer is entirely separated from the silicon surface, the adhesion of the plating layer of the test piece, which is formed by using a 50 ppm PVP-Pd solution, is 6.44 MPa; the adhesion of the plating layer of the test piece, which is formed by using a 100 ppm PVP-Pd solution, is 8.47 MPa. In the cases where cleavages are generated within the silicon substrate via an in-phase separation, the adhesion of the plating layer of the test piece, which is formed by using a 50 ppm PVP-Pd solution, is 13.73 MPa; the adhesion of the plating layer of the test piece, which is formed by using a 100 ppm PVP-Pd solution, is 13.54 MPa.

To sum up, the substrate surface metallization method provided by the present embodiment utilizes electroless plating to replace the silver screen printing, copper plating, or nickel plating, in order to reduce the cost. Especially, the substrate surface metallization method utilizes aminosilane to modify the surface to be plated and utilizes PVP-Pd to form chemical bonds, which enhancing the adhesion between the electroless metallic layer and the silicon surface. The entire process of the substrate surface metallization method is a wet process, which is simplified. The cost can be reduced compared with the chemical vapor deposition process of the prior art, and the yield rate is promoted at the same time.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A substrate having metallized surface, comprising:
   a silicon substrate having a silanated surface;
   an adhesive layer disposed on the silanated surface, wherein the adhesive layer is formed with a plurality of colloidal nanoparticle groups, the colloidal nanoparticle groups each include at least one metallic nanoparticle capped with at least one polymer; and
   an electroless metallic layer bonded to the silanated surface through the adhesive layer;
   wherein the electroless metallic layer and the adhesive layer have chemical bonds formed there between.

2. The substrate having metallized surface of claim 1, wherein the electroless metallic layer is a nickel layer or a nickel alloy layer.

3. The substrate having metallized surface of claim 1, wherein the silanated surface has a silane layer having at least one amino functional group.

4. The substrate having metallized surface of claim 3, wherein the amino functional group has one to three amino-groups.

5. The substrate having metallized surface of claim 1, wherein the polymer is selected from the group consisting of polyvinylpyrrolidone, polyvinyl alcohol, polyacrylic acid, and any combination thereof.

6. The substrate having metallized surface of claim 1, wherein the structural formula of the polymer is

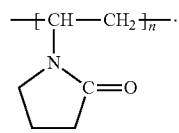

7. The substrate having metallized surface of claim 6, wherein the metallic nanoparticle is capped with an oxygen atom of the polymer.

8. The substrate having metallized surface of claim 6, wherein the polymer has molecular weight ranging from 5000 to 10000.

9. The substrate having metallized surface of claim 6, wherein the colloidal nanoparticle groups each have a diameter ranging from 5 nanometers to 10 nanometers.

* * * * *